(12) United States Patent
Chow et al.

(10) Patent No.: US 7,098,739 B2
(45) Date of Patent: Aug. 29, 2006

(54) LOW NOISE AMPLIFIER WITH LOW NOISE, HIGH ISOLATION BIAS CIRCUIT

(75) Inventors: Yut Hoong Chow, Penang (MY); Zulfa Hasan Abrar, Penang (MY)

(73) Assignee: Avago Technologies Wireless (Singapore) Pte. Ltd., Singapore (SG)

( * ) Notice: Subject to any disclaimer, the term of this patent is extended or adjusted under 35 U.S.C. 154(b) by 35 days.

(21) Appl. No.: 10/975,758

(22) Filed: Oct. 28, 2004

(65) Prior Publication Data
US 2006/0091959 A1    May 4, 2006

(51) Int. Cl.
*H03G 3/10*    (2006.01)
(52) U.S. Cl. ...................................... 330/285
(58) Field of Classification Search ............... 330/285, 330/296, 288
See application file for complete search history.

(56) References Cited
U.S. PATENT DOCUMENTS

| | | | |
|---|---|---|---|
| 6,326,849 B1 * | 12/2001 | Wang et al. | 330/310 |
| 6,753,734 B1 * | 6/2004 | Arell et al. | 330/296 |
| 6,838,932 B1 * | 1/2005 | Izumiyama et al. | 330/51 |
| 2004/0056712 A1 | 3/2004 | Lee et al. | |
| 2004/0130399 A1 | 7/2004 | Andreani et al. | |

\* cited by examiner

*Primary Examiner*—Robert Pascal
*Assistant Examiner*—Hieu Nguyen

(57) ABSTRACT

A low noise amplifier and method for amplifying an input signal uses a high impedance electrical element having both inductance and capacitance connected between an output transistor and a bias circuit to provide noise isolation between the bias circuit and the output transistor. The noise isolation provided by the high impedance electrical element reduces the amount of bias circuit noise introduced into the output signal. In an embodiment, the high impedance electrical element includes an inductor and a capacitor connected in parallel. In another embodiment, the high impedance electrical element includes a grounded transmission line.

17 Claims, 2 Drawing Sheets

LOW NOISE AMPLIFIER WITH LOW NOISE, HIGH ISOLATION BIAS CIRCUIT

BACKGROUND OF THE INVENTION

Low noise amplifiers (LNAs) are used in communication systems to amplify received signals, which tend to be very weak in signal strength. As the name suggests, one of the most important performance factors for LNAs is the amount of noise introduced into the amplified signals by the LNAs.

A typical LNA with an n-channel output transistor includes a bias circuit that provides a bias signal for the n-channel output transistor through a bias signal path. The amount of noise introduced by the LNA is quantified by the Noise Figure. The Noise Figure (NF) for a LNA is mathematically expressed as:

$$NF = 10 \log\left(\frac{S_i}{S_O}\right),$$

where $S_i$ is the input signal-to-noise ratio and $S_o$ is the output signal-to-noise ratio. Thus, external noise picked up at the input of the LNA will degrade $S_i$, and consequently, degrade the NF of the LNA. It is therefore important to minimize any noise contribution at the input, which is primarily due to the bias circuit.

One technique to minimize the noise contribution at the input of the LNA from the bias circuit is to place a capacitor between the bias signal path and ground to shunt some of the noise on the bias signal path to ground. The effectiveness of this shunt capacitor depends on its size. However, due to limited real estate on the integrated circuit on which the LNA is fabricated, placing an effective shunt capacitor in the LNA is not practical.

Another technique is to place a resistor on the bias signal path between the source and the n-channel output transistor, which helps to isolate the noise of the bias circuit from the input of the LNA. However, a large resistor on the bias signal path will degrade large signal performance of the LNA, for example, reducing saturated output power. In addition, a large resistor on the bias signal path will also contribute noise at the input the LNA since noise caused by a resistor is proportional to its resistance. An inductor could be used in place of the resistor, but the inductance needed at lower frequencies, such as 2 GHz, would require a larger-than-practical inductor. Furthermore, such an inductor would significantly increase the series resistance, and thus, would introduce noise at the input of the LNA.

In view of these concerns, there is a need for a LNA and method for amplifying an input signal that reduces the noise introduced by the bias circuit of the LNA without affecting the signal performance of the LNA.

SUMMARY OF THE INVENTION

A low noise amplifier and method for amplifying an input signal uses a high impedance electrical element having both inductance and capacitance connected between an output transistor and a bias circuit to provide noise isolation between the bias circuit and the output transistor. The noise isolation provided by the high impedance electrical element reduces the amount of bias circuit noise introduced into the output signal. In an embodiment, the high impedance electrical element includes an inductor and a capacitor connected in parallel. In another embodiment, the high impedance electrical element includes a grounded transmission line.

A low noise amplifier in accordance with an embodiment of the invention comprises an input to receive an input signal, an output to output an output signal, which is an amplified signal of the input signal, a bias circuit connected between a first voltage terminal and a second voltage terminal, an output transistor connected between the first voltage terminal and the second voltage terminal, the output being connected to the output transistor, a bias signal path connected between the bias circuit and a control terminal of the output transistor, the input being connected to the bias signal path, and a high impedance electrical element having both inductance and capacitance located on the bias signal path. The high impedance electrical element provides noise isolation of the bias circuit from the input to reduce noise in the output signal.

A method for amplifying an input signal in accordance with an embodiment of the invention comprises providing an output transistor and a bias circuit connected to a control terminal of the output transistor, providing a high impedance electrical element having both inductance and capacitance between the bias circuit and the output transistor, the high impedance electrical element providing noise isolation between the bias circuit and the output transistor to reduce noise introduced into the output transistor, receiving the input signal at the control terminal of the output transistor, and amplifying the input signal using the output transistor to produce an output signal.

Other aspects and advantages of the present invention will become apparent from the following detailed description, taken in conjunction with the accompanying drawings, illustrated by way of example of the principles of the invention.

DETAILED DESCRIPTION

Figure 1:
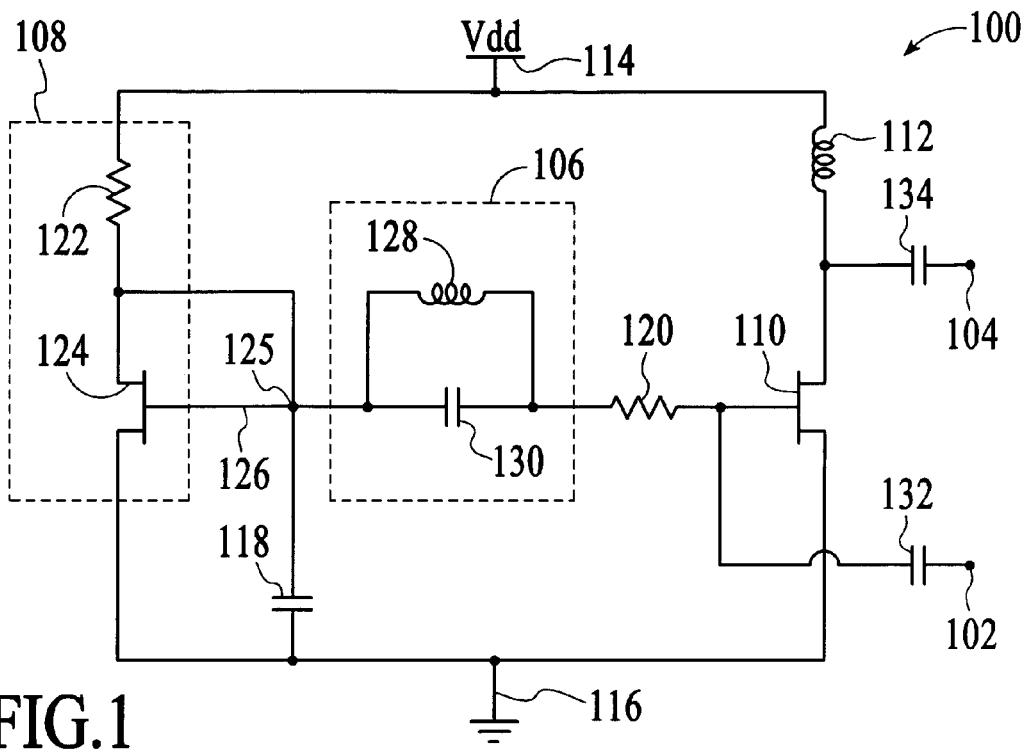
FIG. 1 is a diagram of a low noise amplifier (LNA) with a high impedance electrical element comprised of parallel-connected inductor and capacitor in accordance with an embodiment of the invention.

With reference to FIG. 1, a low noise amplifier (LNA) 100 in accordance with an embodiment of the invention is described. In operation, the LNA 100 receives input signals, such as radio frequency (RF) signals, at an input 102, amplifies the input signals, and transmits the amplified signals as output signals at an output 104 while minimizing the amount of noise introduced into the output signal by the LNA. The LNA 100 uses a high impedance electrical element 106 having both inductance and capacitance between a bias circuit 108 and an output transistor 110 to reduce the amount of noise introduced at the control terminal, e.g., the gate, of the transistor 110. Thus, the Noise Figure (NF) of the LNA 100 is improved over other comparable conventional LNAs.

In the embodiment of FIG. 1, the LNA 100 includes an inductor 112 and the output transistor 110 connected between a voltage terminals 114 and voltage terminal 116. The voltage terminal 114 is connected to a supply voltage Add, while the voltage terminal 116 is connected to ground. The inductor 112 is connected between the voltage terminal 114 and the output transistor 110. Thus, the supply voltage is supplied to the output transistor 110 through the inductor 112. The output transistor 110 is connected to both the input 102 and the output 104. The output transistor 110 functions as an amplifying device to amplify the received signals at the input 102 and transmit the output signals to the output 104. The output transistor 110 may be an n-channel transistor, such as a field effect transistor (FET), and is described herein as being a FET. However, the output transistor 110 can be another type of a transistor. The drain of the output FET 110 is connected to the inductor 112, while the source of the output FET is connected to ground 116. The gate of the output FET 110 is connected to the input 102, which is used to receive input signals that are to be amplified by the LNA 100. The drain of the output FET 110 is connected to the output 104, which is used to output the output signals from the LNA 100.

The LNA 100 further includes the bias circuit 108, a capacitor 118, an optional resistor 120 and the high impedance electrical element 106. The bias circuit 108 is connected to the gate of the output FET 110 to provide a bias signal for the output FET. The bias circuit 108 is connected between the supply voltage terminal 114 and ground 116. In this embodiment, the bias circuit 108 includes a resistor 122 and a transistor 124, such as a FET, that are connected in series to form a reference voltage at a node 125 connected to the gate of the transistor 124. The resistor 122 is connected between the supply voltage terminal 114 and the transistor 124. The gate of the transistor 124 is connected to the drain of the transistor 124. The gate of the transistor 124 is also connected to the gate of the output FET 110 through a bias signal path 126, which is the supply line used to provide a bias signal from the bias circuit 108 to the output FET 110.

The capacitor 118 is connected between the node 125 on the bias signal path 126 and the voltage terminal 116, i.e., ground, to shunt some of the noise on the bias signal path to ground. Thus, some of the noise of the bias circuit 108 is prevented from reaching the gate of the output FET 110, where it could be amplified and contribute to the noise in the output signal at the output 104. The optional resistor 120 is located on the bias signal path 126 to help isolate the noise of the bias circuit 108 from the input 102 of the LNA 100. The resistor 120 is optional due to the inclusion of the high impedance electrical element 106 in the LNA 100, which provides significant noise isolation of the bias circuit 108 from the input 102 of the LNA. However, the resistor 120 can be included in the LNA 100 to further improve noise isolation between the bias circuit 108 and the input 102 of the LNA. As an example, if included in the LNA 100, the optional resistor 120 may have a resistance that is twenty to thirty percent of the resistance of a similar resistor in comparable conventional LNAs.

Similar to the optional resistor 120, the high impedance electrical element 106 is located on the bias signal path 126. As stated above, the high impedance electrical element 106 provides a high impedance to isolate the noise of the bias circuit 108 from the input 102 of the LNA 100. The high impedance electrical element 106 has both inductance and capacitance to provide the high impedance.

In an embodiment of the invention, the high impedance electrical element 106 is comprised of an inductor 128 and a capacitor 130, as shown in FIG. 1. The inductor 128 and the capacitor 130 are connected in parallel on the bias signal path 126. The inductance of the inductor 128 and the capacitance of the capacitor 130 can be selected to resonate at the frequency of interest to provide a high impedance from the input 102 of the LNA 100 to the gate of the transistor 124 of the bias circuit 108. Thus, noise of the bias circuit 108 is isolated from the input 102 of the LNA 100 to improve the NF of the LNA. The inductor 128 and the capacitor 130 also form an impedance matching circuit that enables the input impedance to be matched to the gate of the output FET 110.

Figure 2:
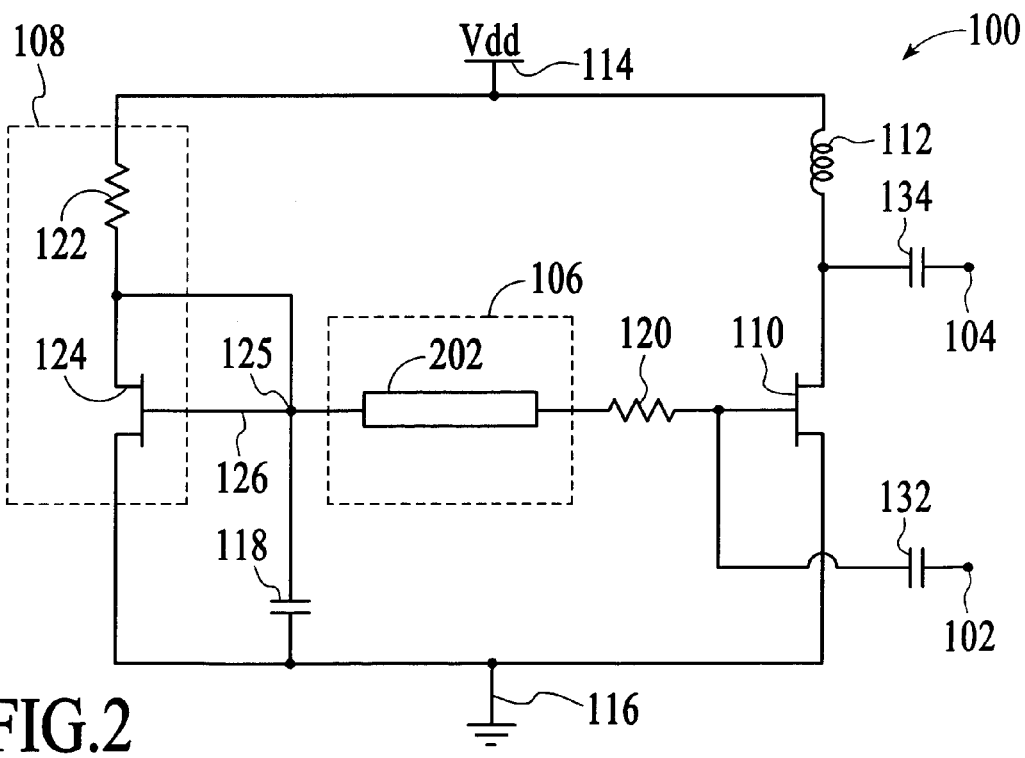
FIG. 2 is a diagram of the LNA of FIG. 1 with a high impedance electrical element comprised of a grounded transmission line in accordance with another embodiment of the invention.

In another embodiment of the invention, the high impedance electrical element 106 is comprised of a grounded transmission line 202, as shown in FIG. 2. The grounded transmission line 202 has both inductance and capacitance to provide a high impedance from the input 102 of the LNA 100 to the gate of the transistor 124 of the bias circuit 108. The optimal value of impedance of the grounded transmission line 202 is determined by the input impedance of the output FET 110. In general, a larger impedance of the grounded transmission line 202 provides better isolation and noise performance.

Figure 3:
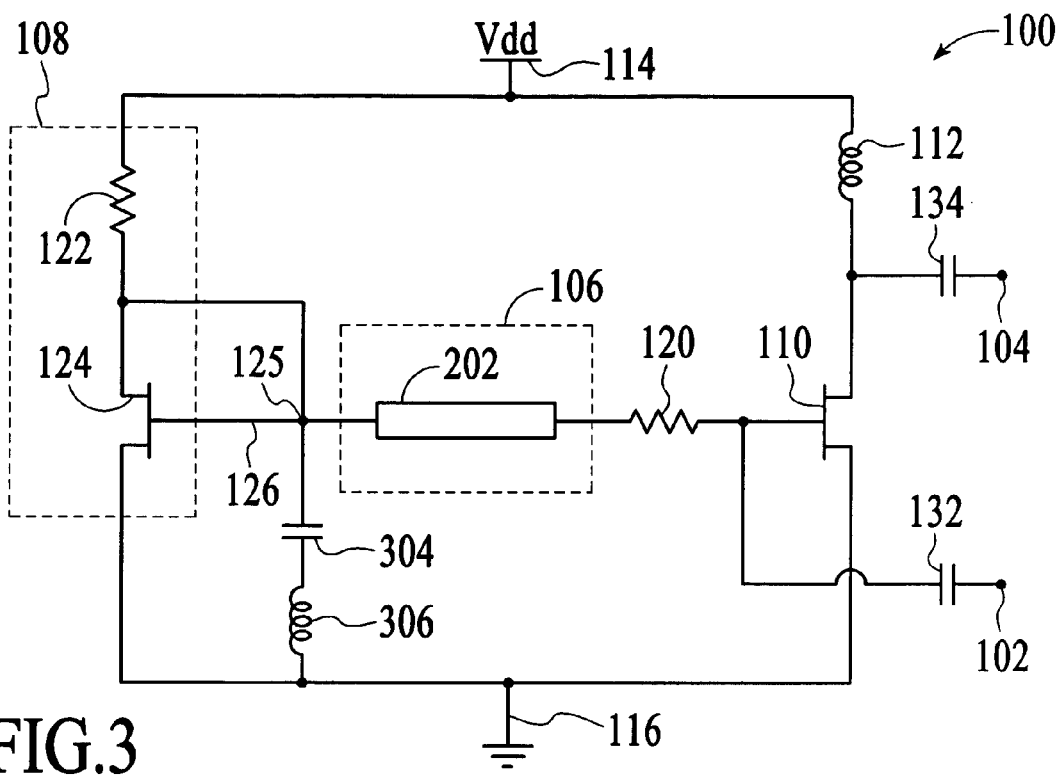
FIG. 3 is a diagram of the LNA of FIG. 2 with series-connected inductor and capacitor in accordance with an alternative embodiment of the invention.

In an alternative embodiment of the invention, as shown in FIG. 3, the shunt capacitor 118, is replaced with a capacitor 304 and an inductor 306 that are connected in series between the node 125 on the bias signal path 126 and ground 116. The capacitance of the capacitor 304 and the inductance of the inductor 306 can be chosen to be series resonant at the frequency of interest. This enables the capacitance of the capacitor 306 to be smaller than the capacitance of the capacitor 118 of FIGS. 1 and 2. Thus, in this alternative embodiment, a smaller sized capacitor can be used for the capacitor 304, which saves real estate on the integrated circuit on which the LNA 100 is fabricated.

As shown in FIGS. 1, and 3, the LNA 100 further includes an input capacitor 132 at the input 102 and an output capacitor 134 at the output 104. The capacitors 132 and 134 are used to selectively allow signals at the frequency of interest to be transmitted through the input 102 and the output 104 of the LNA 100.

The design of the LNA 100 in accordance with different embodiments of the invention improves the NF of the LNA 100 with respect to other comparable conventional LNAs. The NF improvement of the LNA 100 is about 0.2 dB of minimum NF reduction with no penalty to large signal performance or gain of the LNA. This improvement is significant considering that the NF of typical LNAs is in the order of 0.7 dB.

Figure 4:
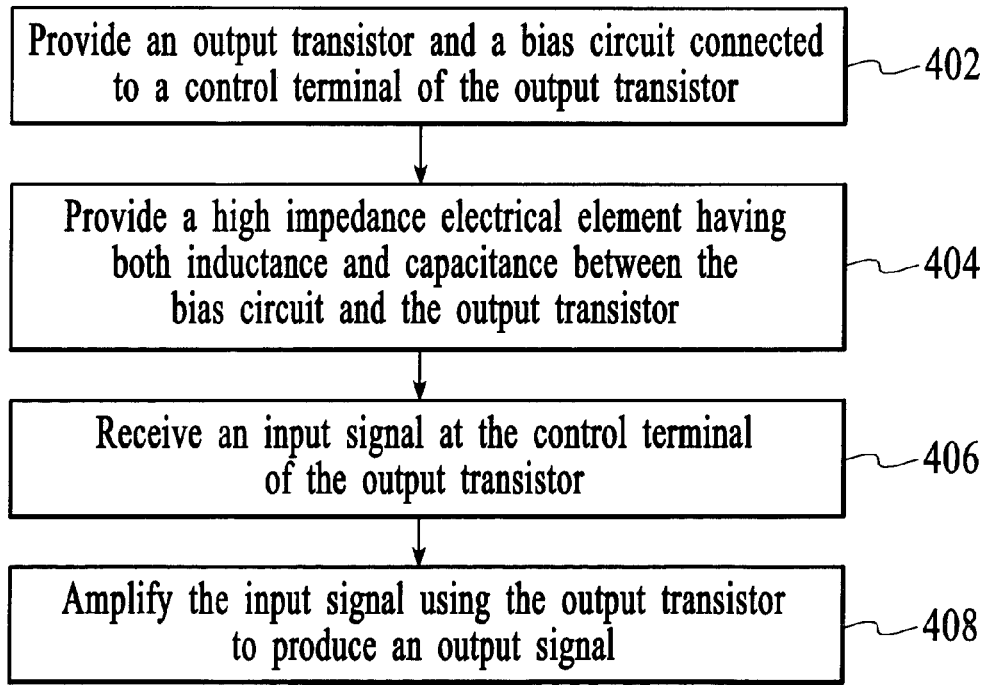
FIG. 4 is a process flow diagram of a method for amplifying an input signal in accordance with an embodiment of the invention.

A method for amplifying an input signal in accordance with an embodiment of the invention is described with reference to the process flow diagram of FIG. 4. At block 402, an output transistor and a bias circuit connected to a control terminal of the output transistor are provided. As an example, the output transistor may be an n-channel FET. Next, at block 404, a high impedance electrical element having both inductance and capacitance is provided between the bias circuit and the output transistor. The high impedance electrical element provides noise isolation between the bias circuit and the output transistor to reduce the amount of noise introduced into the output transistor. Next, at block 406, an input signal is received at the control terminal of the output transistor. Next, at block 408, the received input signal is amplified using the output transistor to produce an output signal.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A low noise amplifier comprising:
   an input to receive an input signal;
   an output to output an output signal, said output signal being an amplified signal of said input signal;
   bias circuit connected between a first voltage terminal and a second voltage terminal;
   an output transistor connected between said first voltage terminal and said second voltage terminal, said output being connected to said output transistor;
   a bias signal path connected between said bias circuit and a control terminal of said output transistor, said input being connected to said bias signal path; and
   a high impedance electrical element having both inductance and capacitance located on said bias signal path between said bias circuit and said output transistor, said high impedance electrical element providing noise isolation of said bias circuit from said input to reduce noise in said output signal, wherein said high impedance electrical element includes an inductor and a capacitor that are connected in parallel on said bias signal oath or a grounded transmission line on said bias signal path.

2. The low noise amplifier of claim of 1 wherein said output transistor is an n-channel field effect transistor.

3. The low noise amplifier of claim 1 further comprising a resistor connected in series with said the high impedance electrical element on said bias signal path.

4. The low noise amplifier of claim 1 further comprising an inductor and a capacitor connected in series between a node on said bias signal path and said second voltage terminal, said bias circuit providing a reference voltage at said node.

5. The low noise amplifier of claim of claim 1 wherein said bias circuit includes a resistor and a transistor that are connected in series between said first voltage terminal and said second voltage terminal.

6. The low noise amplifier of claim 1 further comprising a capacitor connected between a node on said bias signal path and said second voltage terminal, said bias circuit providing a reference voltage at said node.

7. A method for amplifying an input signal, said method comprising:
   providing an output transistor and a bias circuit connected to a control terminal of said output transistor, said bias circuit including a resistor and a transistor that are connected in series between a first voltage terminal and a second voltage terminal;
   providing a high impedance electrical element having both inductance located on a bias signal path connected between a control terminal of said transistor of said bias circuit and said control terminal of said output transistor, said high impedance electrical clement providing noise isolation between said bias circuit and said output transistor to reduce noise introduced into said output transistor;
   receiving said input signal at said control terminal of said output transistor, and
   amplifing said input signal using said output transistor to produce an output signal.

8. The method of claim 7 wherein said high impedance electrical element includes an inductor and a capacitor that are connected in parallel.

9. The method of claim 7 wherein said high impedance electrical element includes a grounded transmission line.

10. The method of claim 9 further comprising providing an inductor and a capacitor connected in series between a node on a bias signal path and a voltage terminal, said bias signal path being connected to said bias circuit and said output transistor, said bias circuit providing a reference voltage at said node.

11. A low noise amplifier comprising:
    an input to receive an input signal;
    an output to output an output signal, said output signal being an amplified signal of said input signal;
    a bias circuit connected between a first voltage terminal and a second voltage terminal, said bias circuit including a resistor and a transistor that are connected in series;
    an output transistor connected between said first voltage terminal and said second voltage terminal, said output being connected to said output transistor;
    a bias signal path connected between a control terminal of said transistor and a control terminal of said output transistor, said input being connected to said bias signal path; and
    a high impedance electrical element having both inductance and capacitance located on said bias signal path between said bias circuit and said input, said high impedance electrical element providing noise isolation of said bias circuit from said input to reduce noise in said output signal.

12. The low noise amplifier of claim of 11 wherein said output transistor is an n-channel field effect transistor.

13. The low noise amplifier of claim 11 wherein said high impedance electrical clement includes an inductor and a capacitor that are connected in parallel on said bias signal pat.

14. The low noise amplifier of claim 13 farther comprising a resistor connected in series with said high impedance electrical element on said bias signal path.

15. The low noise amplifier of claim 11 wherein said high impedance electrical element includes a grounded transmission line on said bias signal path.

16. The low noise amplifier of claim 15 further comprising an inductor and a capacitor connected in series between a node on said bias signal path and said second voltage terminal, said bias circuit providing a reference voltage at said node.

17. The low noise amplifier of claim 11 further comprising a capacitor connected between a node on said bias signal path and said second voltage terminal, said bias circuit providing a reference voltage at said node.

* * * * *

UNITED STATES PATENT AND TRADEMARK OFFICE
CERTIFICATE OF CORRECTION

PATENT NO. : 7,098,739 B2  Page 1 of 1
APPLICATION NO. : 10/975758
DATED : August 29, 2006
INVENTOR(S) : Yut Hoong Chow et al.

It is certified that error appears in the above-identified patent and that said Letters Patent is hereby corrected as shown below:

Title Page, item (73), (Assignee), Line 1, after "Wireless" insert -- IP --;

Column 5, Line 14, Claim 1, before "bias" insert -- a --;

Column 5, Line 30, Claim 1, delete "oath" and insert -- path --;

Column 5, Line 35, Claim 3, after "said" delete "the";

Column 5, Line 42, Claim 5, after "of claim" delete "of claim";

Column 5, Line 62, Claim 7, delete "clement" and insert -- element --;

Column 6, Line 2, Claim 7, delete "introduccd" and insert -- introduced --;

Column 6, Line 4, Claim 7, after "transistor" delete "," and insert -- ; --;

Column 6, Line 5, Claim 7, delete "amplifing" and insert -- amplifying --;

Column 6, Line 43, Claim 13, delete "clement" and insert -- element --;

Column 6, Line 45, Claim 13, delete "pat." and insert -- path. --;

Column 6, Line 46 (approx.), Claim 14, delete "farther" and insert -- further --.

Signed and Sealed this

Eighth Day of June, 2010

David J. Kappos
*Director of the United States Patent and Trademark Office*